US006799296B2

(12) United States Patent
Kong et al.

(10) Patent No.: US 6,799,296 B2
(45) Date of Patent: Sep. 28, 2004

(54) VITERBI DETECTOR FOR OPTICAL DISK SYSTEM

(75) Inventors: Jun-jin Kong, Sungnam (KR); Sung-han Choi, Anyang (KR); Jae-wook Lee, Osan (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 438 days.

(21) Appl. No.: 09/985,122

(22) Filed: Nov. 1, 2001

(65) Prior Publication Data

US 2002/0053061 A1 May 2, 2002

(30) Foreign Application Priority Data

Nov. 1, 2000 (KR) ........................................ 2000-64521

(51) Int. Cl.$^7$ ............................................ H03M 13/00
(52) U.S. Cl. ...................................................... 714/795
(58) Field of Search ................................. 714/794–795, 714/791–793; 375/262, 265, 341

(56) References Cited

U.S. PATENT DOCUMENTS 5,530,707 A * 6/1996 Lin ............................ 714/792
5,724,394 A * 3/1998 Ikeda et al. ................. 375/341
6,088,404 A * 7/2000 Jekal .......................... 375/341
6,668,351 B1 * 12/2003 Ikeda et al. ................. 714/786

OTHER PUBLICATIONS

Nakamura et al., A 755 Mb/s Viterbi decoder for the RM (64, 35, 8) subcode, 1999, IEEE, p. 1–9.*

* cited by examiner

Primary Examiner—Albert Decady
Assistant Examiner—Shelly A Chase
(74) Attorney, Agent, or Firm—Sughrue Mion, PLLC

(57) ABSTRACT

A high speed Viterbi detector for an optical disk system, includes a frequency dividing unit for generating an auxiliary clock at one-third of the main clock frequency, a branch metric calculation unit for calculating each of a plurality of branch metrics, a serial-to-parallel converting unit for outputting each of the branch metrics at the main clock frequency in units of 3 state bits, an addition/comparison/selection unit for adding the branch metrics and previously stored state metrics and for comparing the addition results to select and output the minimum of the addition results as a new state metric, and for outputting a corresponding path selection signal, at the auxiliary clock frequency, a path memory for storing the path selection signal and for outputting parallel data corresponding to the path selection signal, at the auxiliary clock frequency, and a parallel-to-serial converting unit for converting the path memory output into serial data.

13 Claims, 14 Drawing Sheets

PRIOR ART

PRIOR ART

FIG.3C

| CURRENT STATE | INPUT/OUTPUT | NEXT STATE |
|---|---|---|
| +1+1+1 | +MAX +MAX +MAX/+1+1+1 | +1+1+1 |
| -1+1+1 | +MID +MAX +MAX/+1+1+1 | |
| -1-1+1 | ZERO +MID +MAX/+1+1+1 | |
| -1-1-1 | -MID ZERO +MID/+1+1+1 | |
| +1+1+1 | +MAX +MAX +MID/+1+1-1 | +1+1-1 |
| -1+1+1 | +MID +MAX +MID/+1+1-1 | |
| -1-1+1 | ZERO +MID +MID/+1+1-1 | |
| +1+1+1 | +MAX +MID ZERO/+1-1-1 | +1-1-1 |
| -1+1+1 | +MID +MID ZERO/+1-1-1 | |
| +1-1-1 | -MID -MID ZERO/-1+1+1 | -1+1+1 |
| -1-1-1 | -MAX -MID ZERO/-1+1+1 | |
| +1+1-1 | ZERO -MID -MID/-1-1+1 | -1-1+1 |
| +1-1-1 | -MID -MAX -MID/-1-1+1 | |
| -1-1-1 | -MAX -MAX -MID/-1-1+1 | |
| +1+1+1 | +MID ZERO -MID/-1-1-1 | -1-1-1 |
| +1+1-1 | ZERO -MID -MAX/-1-1-1 | |
| +1-1-1 | -MID -MAX -MAX -1-1-1 | |
| -1-1-1 | -MAX -MAX -MAX/-1-1-1 | |

PRIOR ART

FIG.8C

| CURRENT STATE | INPUT/OUTPUT | NEXT STATE |
|---|---|---|
| +1+1+1 | +MAX +MAX +MAX +MAX/+1+1+1+1 | +1+1+1 |
| +1-1-1 | -MID -MID ZERO +MID/-1+1+1+1 | |
| -1+1+1 | +MID +MAX +MAX +MAX/+1+1+1+1 | |
| -1-1+1 | ZERO +MID +MAX +MAX/+1+1+1+1 | |
| -1-1-1 | -MID ZERO +MID +MAX/+1+1+1+1 | |
| -1-1-1 | -MAX -MID ZERO +MID/-1+1+1+1 | |
| +1+1+1 | +MAX +MAX +MAX +MID/+1+1+1-1 | +1+1-1 |
| -1+1+1 | +MID +MAX +MAX +MID/+1+1+1-1 | |
| -1-1+1 | ZERO +MID +MAX +MID/+1+1+1-1 | |
| -1-1-1 | -MID ZERO +MID +MID/+1+1+1-1 | |
| +1+1+1 | +MAX +MAX +MID ZERO/+1+1-1-1 | +1-1-1 |
| -1+1+1 | +MID +MAX +MID ZERO/+1+1-1-1 | |
| -1-1+1 | ZERO +MID +MID ZERO/+1+1-1-1 | |
| +1+1-1 | ZERO -MID -MID ZERO/-1-1+1+1 | -1+1+1 |
| +1-1-1 | -MID -MAX -MID ZERO/-1-1+1+1 | |
| -1-1-1 | -MAX -MAX -MID ZERO/-1-1+1+1 | |
| +1+1+1 | +MID ZERO -MID -MID/-1-1-1+1 | -1-1+1 |
| +1+1-1 | ZERO -MID -MAX -MID/-1-1-1+1 | |
| +1-1-1 | -MID -MAX -MAX -MID/-1-1-1+1 | |
| -1-1-1 | -MAX -MAX -MAX -MID/-1-1-1+1 | |
| +1+1+1 | +MAX +MID ZERO -MID/+1-1-1-1 | -1-1-1 |
| +1+1+1 | +MID ZERO -MID -MAX/-1-1-1-1 | |
| +1+1-1 | ZERO -MID -MAX -MAX/-1-1-1-1 | |
| +1-1-1 | -MID -MAX -MAX -MAX/-1-1-1-1 | |
| -1+1+1 | +MID +MID ZERO -MID/+1-1-1-1 | |
| -1-1-1 | -MAX -MAX -MAX -MAX/-1-1-1-1 | |

…

VITERBI DETECTOR FOR OPTICAL DISK SYSTEM

BACKGROUND OF THE INVENTION

1. Field of the Invention

The present invention relates to an apparatus for reproducing signals from an optical disk, and more particularly to a high speed Viterbi detector based on radix-8 and radix-16 for reproducing signals from an optical disk by executing a new state metric finding operation for a plurality of states at one time over a period of a plurality of clocks. The present application is based on Korean Patent Application No. 2000-64521, which is incorporated herein by reference.

2. Description of the Related Art

An optical channel can be modeled with a simple Partial Response (PR), and the reproduction apparatus can perform the PR processing using a Viterbi detector. Partial Response signal processing is a method for reproducing a symbol by extracting information from several adjacent data symbols. In other words, while a data symbol passes a channel, it affects the several adjacent data symbols. Thus, this characteristic can be utilized in recovering the data symbol.

The characteristics of the optical channel depend on a density of data symbol, a gap between tracks, characteristics of an optical pickup and a modulation scheme, etc.

There have been proposed Viterbi detection method and apparatus for finding a simple transfer function having the maximum likelihood with the characteristics of an optical channel, and for use in a partial response maximum likelihood (PRML) system for reproducing signals from a high-speed optical medium.

The characteristics of a channel can be modeled into a form of a simple convolution encoder, and, for example, if a constraint length of the transfer function k=4 in the modeling, the number of states of the convolution encoder becomes $2^{k-1}=8$. However, the data encoded by an Eight-to-Fourteen modulation (EFM) scheme are restricted to have a signal conversion interval more than 3T.

FIG. 1 is a trellis diagram of a conventional radix-2 Viterbi detector for use in reproducing data signals from the optical disk in a conventional optical disk system.

According to the characteristic of a run-length limited code, RLL(2, 10) code, used in the conventional optical disk system, signals having a period of 1T and 2T do not exist therein. Thus, the states '+1−1+1' and '−1+1−1' are removed so that the trellis state comprises 6 states. Also, the trellis paths are simply formed not to produce 1T and 2T signals.

FIG. 2 is a block diagram of a radix-2 Viterbi detector for use in a conventional optical disk system for implementing the trellis shown in FIG. 1.

Referring to FIG. 2, the conventional Viterbi detector comprises a branch metric calculation unit (BMC) 2, an addition/comparison/selection unit 4 and a path memory 8.

At every clock signal, one data symbol is input to the conventional Viterbi detector. Then, for every input symbol, the branch metric calculation unit 2 calculates 5 branch metrics that correspond to the absolute values +MAX, +MID, ZERO, −MID, and −MAX of the 5 differences between the input data symbol level and the 5 reference voltage levels.

The addition/comparison/selection unit 4, then, adds the 5 branch metrics generated by the branch metric calculation unit 2 and previous state metrics stored in it, respectively, to obtain the new state metrics, and selects the minimum new state metric thereamong to determine a survival path. In this processing, the addition/comparison/selection unit 4 performs the overflow controls in order to prevent any overflow of the state metrics. Specifically, the addition/comparison/selection unit 4 monitors all the state metrics and if it detects that all the state metrics exceed a predetermined value it subtracts a certain value from all the state metrics.

The path memory 8 stores the selected survival paths sequentially output from the addition/comparison/selection unit 4 and outputs them serially.

All of the branch metric calculation unit 2, the addition/comparison/selection unit 4 and the path memory 8 constituting the conventional Viterbi detector operate at the same channel clock speed which is equal to the input speed of the data symbol.

As such, the branch metric calculation unit 2 performing the simple subtraction and the absolute value operation, and the path memory 8 just performing exchange of data do not give any significant overhead to increase the operational speed of the Viterbi detector.

However, the addition/comparison/selection unit 4 performs, over one clock period, the complicated operations comprising the steps of adding the branch metric and previous state metric according to the trellis structure, comparing the new state metrics to obtain the survival path, which corresponds to the minimum state metric, and operating to prevent overflow of each of the state metrics and then obtaining the final new state metric for use in the next clock cycle.

Therefore, the complicated operation of the addition/comparison/selection unit is considered as an obstruction for implementing a high speed Viterbi detector in the optical disk market which is intensified with competition for the higher operation speed.

SUMMARY OF THE INVENTION

Accordingly, an object of the present invention is to provide a high speed Viterbi detector including an addition/comparison/selection unit for operating at one-third of the clock speed by reconstructing the trellis structure based on a radix-8 structure.

Another object of the present invention is to provide a high speed Viterbi detector including an addition/comparison/selection unit for operating at a one-fourth of the clock speed by reconstructing the trellis structure based on a radix-16 structure.

In order to achieve the above-described objects of the present invention, there is provided a radix-8 Viterbi detector for use in a signal reproduction apparatus for a high speed optical disk, including a frequency dividing unit for dividing a main clock frequency to generate an auxiliary clock at one-third of the main clock frequency; a branch metric calculation unit for calculating each branch metrics via a predetermined transfer function using the input data at the main clock frequency; a serial-to-parallel converting unit for outputting each of the branch metrics calculated by said branch metric calculation unit at the main clock frequency in units of 3 state bits; an addition/comparison/selection unit for adding the branch metrics input from said serial-to-parallel converting unit and previous state metrics which are stored before the 3 state bits are input and for comparing the addition results to select and output the minimum of the addition results as a new state metric, and for outputting a corresponding path selection signal, at the auxiliary clock frequency; a path memory for storing the path selection signal and for outputting parallel data corresponding to said path selection signal, at the auxiliary clock frequency; and a parallel-to-serial converting unit for converting the parallel data output by said path memory into serial data.

In addition, there is provided a radix-16 Viterbi detector for use in a signal reproduction apparatus for a high speed optical disk according to a preferred embodiment of the present invention, including a frequency dividing unit for dividing a main clock frequency to generate an auxiliary clock at one-fourth of the main clock frequency; a branch metric calculation unit for calculating each branch metric via a predetermined transfer function using the input data at the main clock frequency; a serial-to-parallel converting unit for outputting each of the branch metrics calculated by said branch metric calculation unit at the main clock frequency in units of 4 state bits; an addition/comparison/selection unit for adding the branch metrics input from said serial-to-parallel converting unit and previous state metrics which are stored before the 4 state bits are input and for comparing the addition results to select and output the minimum of the addition results as a new state metric, and for outputting a corresponding path selection signal, at the auxiliary clock frequency; a path memory for storing the path selection signal and for outputting parallel data corresponding to said path selection signal, at the auxiliary clock frequency; and a parallel-to-serial converting unit for converting the parallel data output by said path memory into serial data.

There is also provided a radix-N Viterbi detector employed in a signal reproduction apparatus for a high speed optical disk according to a preferred embodiment of the present invention, including a frequency dividing unit for dividing a main clock frequency to generate an auxiliary clock at one-Nth of the main clock frequency; a branch metric calculation unit for calculating each branch metric via a predetermined transfer function using the input data at the main clock frequency; a serial-to-parallel converting unit for outputting each of the branch metrics calculated by said branch metric calculation unit at the main clock frequency in units of N state bits; an addition/comparison/selection unit for adding the branch metrics input from said serial-to-parallel converting unit and previous state metrics which are stored before the N state bits are input and for comparing the addition results to select and output the minimum of the addition results as a new state metric, and for outputting a corresponding path selection signal, at the auxiliary clock frequency; a path memory for storing the path selection signal and for outputting parallel data corresponding to said path selection signal, at the auxiliary clock frequency; and a parallel-to-serial converting unit for converting the parallel data output by said path memory into serial data.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 3C is a table illustrating the change of state of and the output of the Viterbi detector comprising three radix-2 Viterbi stages in response to the input signals;

FIG. 8C is a table illustrating the change of state of and the output of the Viterbi detector comprising four radix-2 Viterbi stages in response to the input signals;

DETAILED DESCRIPTION OF THE PREFERRED EMBODIMENTS

A Viterbi detector in accordance with preferred embodiments of the present invention will now be described in detail with reference to the accompanying drawings.

The first embodiment of the present invention is a Viterbi detector configured with radix-8. The radix-8 structure has been made by coupling the three conventional radix-2 stages.

Figure 1:
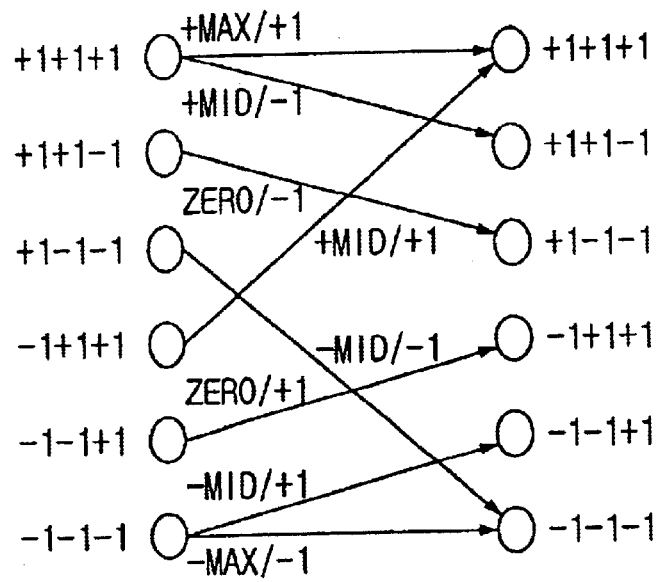
FIG. 1 is a diagrammatic view showing a trellis of a radix-2 Viterbi detector for use in a conventional optical disk system.
Figure 2:
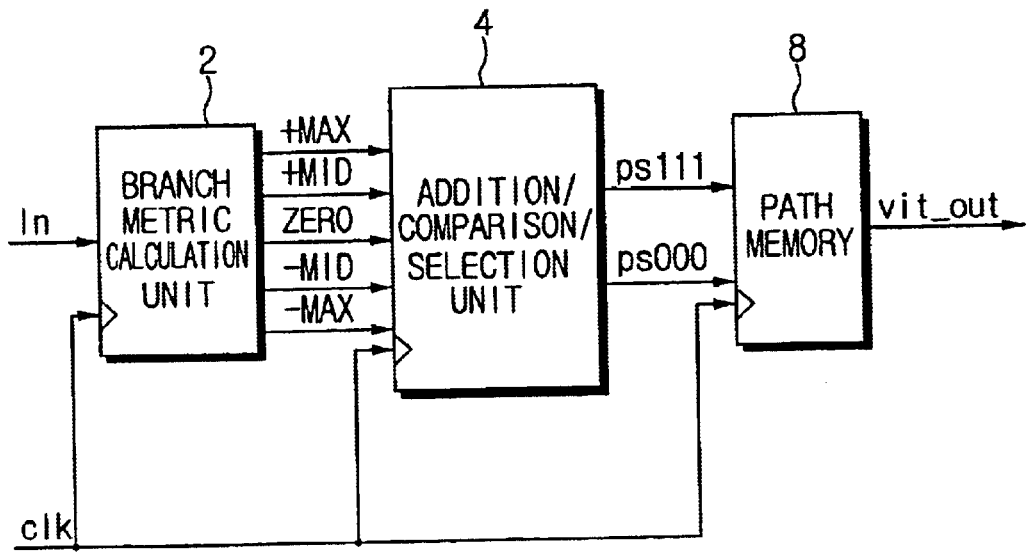
FIG. 2 is a block diagram showing a radix-2 Viterbi detector for use in a conventional optical disk system.
Figure 3A:
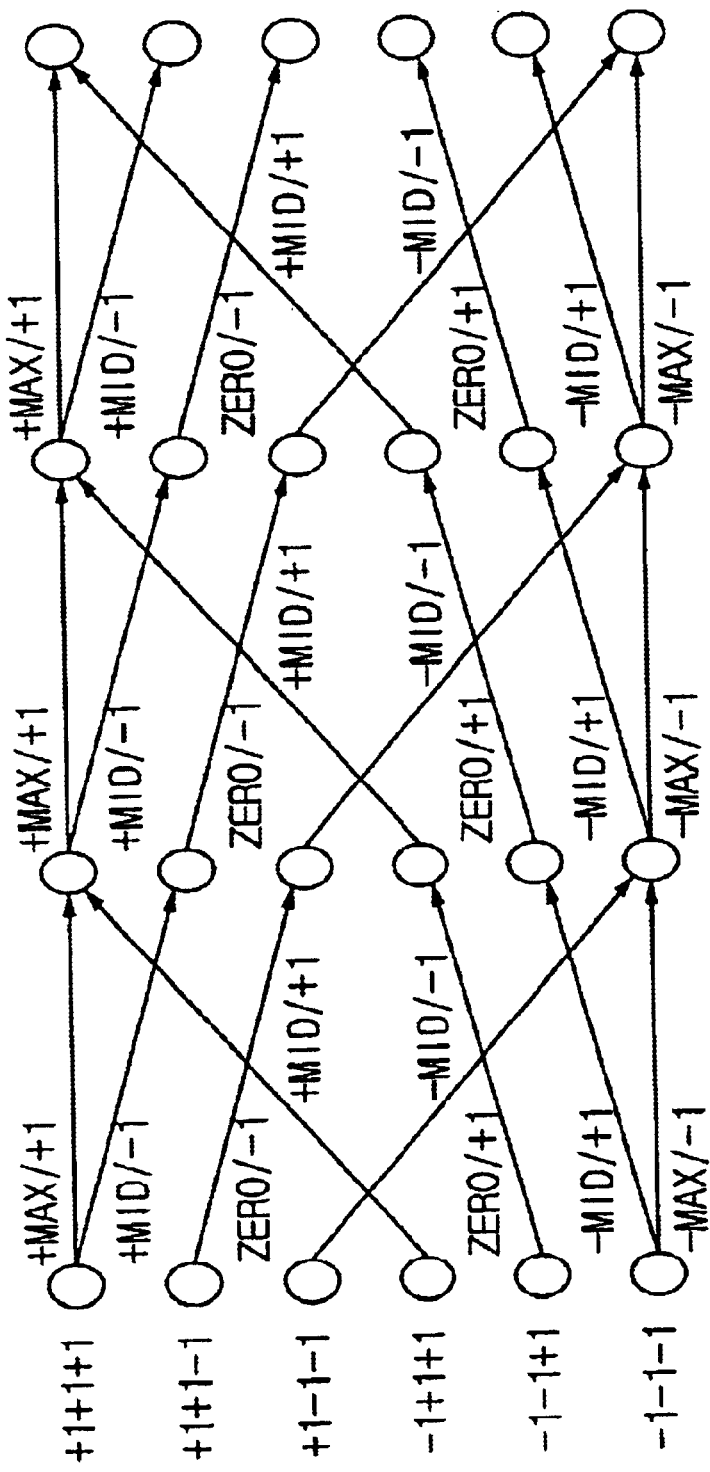
FIG. 3A is a diagrammatic view showing a trellis of a conventional Viterbi detector comprising three radix-2 Viterbi stages.

FIG. 3A shows a trellis diagram of the conventional radix-8 Viterbi detector comprising the three radix-2 stages, wherein an input signal is assumed to have a channel characteristic of an optical disk represented by PR[a, b, b, a] (i.e., $a+bz^{-1}+bz^{-2}+az^{-3}$).

Referring to FIG. 3A, a description with respect to an example where a first input signal, +1+1+1, is processed will be made. Adding +1 to the input signal +1+1+1 makes +MAX (+MAX/+1). Adding +1 to the +MAX makes +MAX (+MAX/+1), further adding +1 again to the result makes +MAX(+MAX/+1).

That is, when the input signal, +1+1+1, passes the trellis comprising the three (+1) radix 2 stages over three operation clocks, i.e., when the input signal passes each of the (+1), (+1), (+1) radix 2 stages at every clock period, the final output signal becomes (+1+1+1).

By the way, such a trellis showing that the input signal passes the radix-2 detector three times can be represented by a new trellis showing that the input signal passes a radix-8 detector.

Figure 3B:
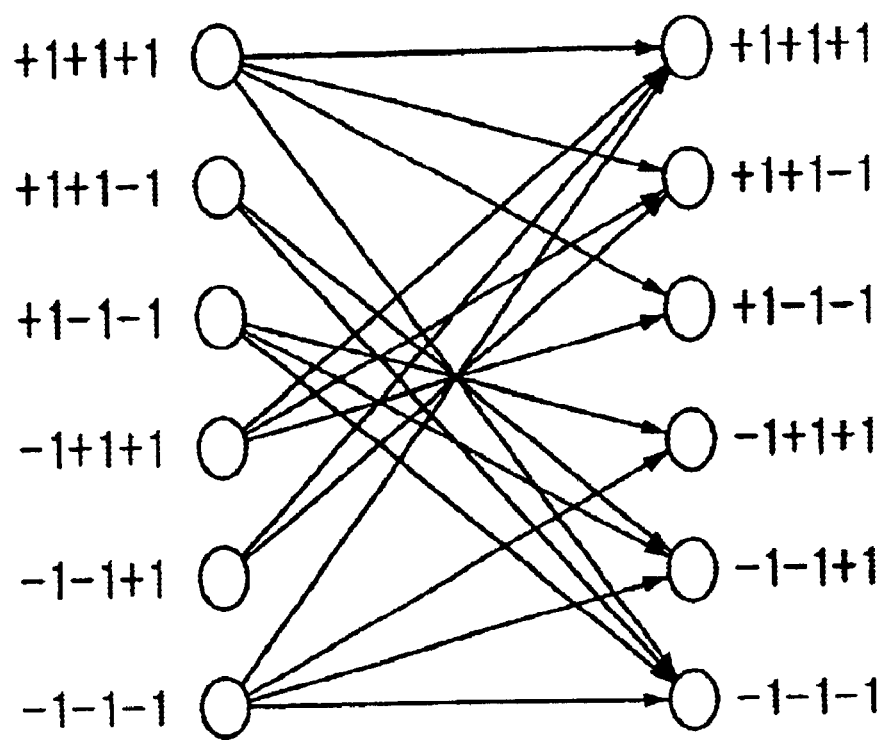
FIG. 3B is a diagrammatic view showing a trellis of a radix-8 Viterbi detector for use in an optical disk system according to an embodiment of the present invention.

FIG. 3B illustrates the trellis diagram of a radix-8 Viterbi detector for use in an optical disk system according to the present invention. FIG. 3C shows a table illustrating the change of the state of and the output signal of the Viterbi detector comprising the three radix-2 stages according to the varying input signal.

Generally, since the complexity of any operation circuit increases as the radix number increases, it is difficult to obtain a high gain. However, in the trellis structure applied to the optical disk system, it can be seen that the complexity of an operation circuit does not increase so much even though the radix number increases.

The inputs of the trellis are the combinations of the branch metrics representing the absolute values of the differences between the input signal and each of the 5 reference signals, and the outputs of the trellis correspond to the respective branch metrics.

Figure 4:
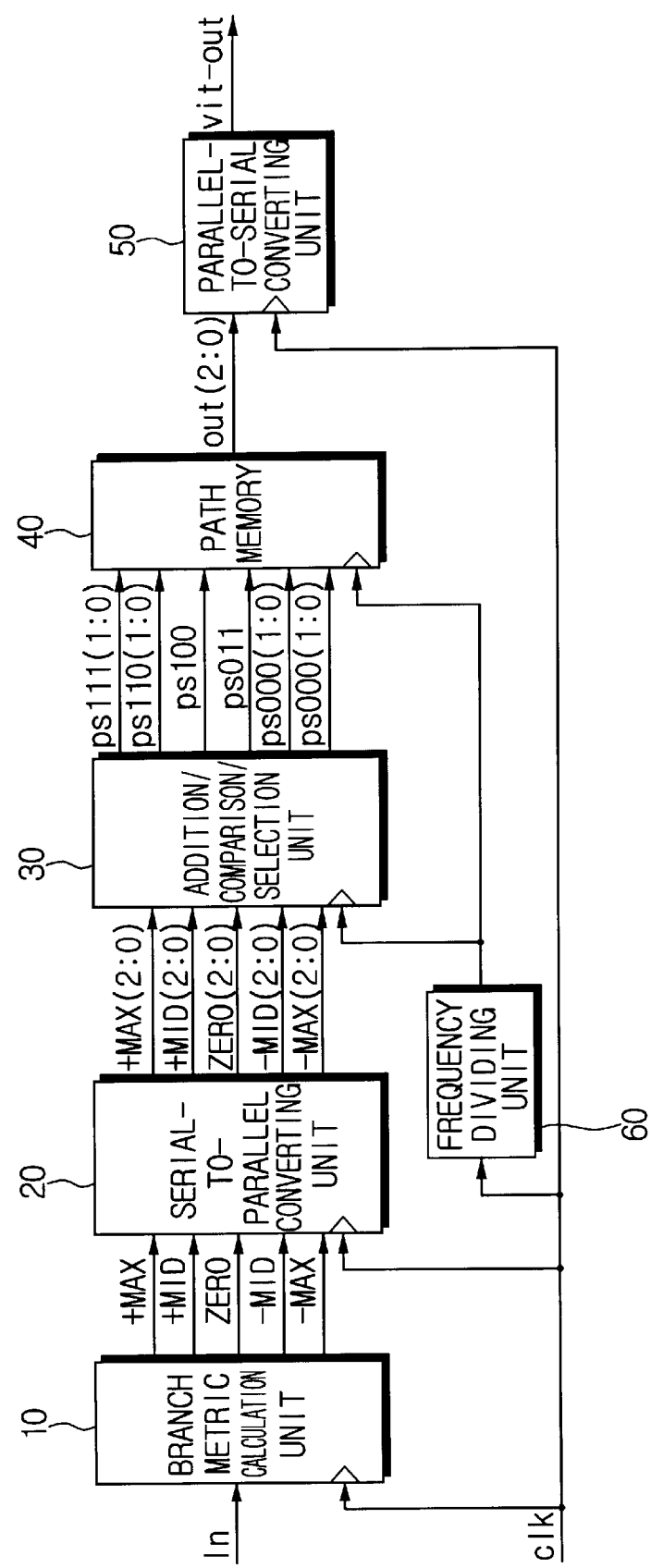
FIG. 4 is a block diagram showing a radix-8 Viterbi detector of the present invention for use in an optical disk system.

FIG. 4 illustrates a Viterbi detector performing the radix-8 trellis shown in FIG. 3B for use in an optical system. Referring to FIG. 4, the radix-8 Viterbi detector of the present invention comprises a branch metric calculation unit 10, a serial-to-parallel converting unit 20, an addition/comparison/selection unit 30, a path memory 40, a parallel-to-serial converting unit 50, and a clock frequency dividing unit 60.

Figure 5:
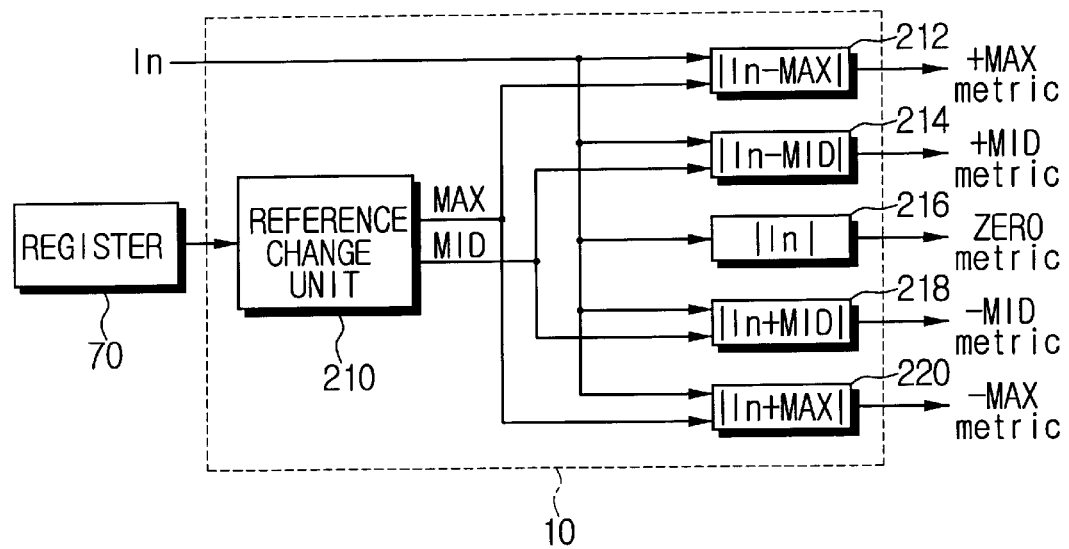
FIG. 5 is a block diagram showing a structure of a branch metric calculation unit of the radix-8 Viterbi detector of the present invention for use in an optical disk system.

FIG. 5 is a block diagram showing a structure of a branch metric calculation unit 10 for obtaining branch metrics. The branch metric calculation unit 10 comprises a reference change means 210 and absolute value calculation units 212, 214, 216, 218 and 220, and calculates each of the branch metrics using the input data provided with the main clock frequency.

The reference change means 210 determines the reference MAX and MID levels, which depend on the preset values of a and b referred to by the channel characteristics of the optical disk system, PR[a, b, b, a] (i.e., $a+bz^{-1}+bz^{-2}+az^{-3}$). A micro-computer register 70 changes the reference MAX and MID levels.

Each of the absolute value calculation units 212, 214, 216, 218 and 220 calculates the respective Euclidean distance between the input data and each of the state reference levels to obtain 5 branch metrics, i.e., +MAX metric, +MID metric, ZERO metric, −MID metric, and −MAX metric.

The branch metric calculation unit 10 can be used commonly regardless of the radix of the Viterbi detector. The branch metric calculation unit 10 operates at the channel clock that is not subjected to the frequency-division.

The serial-to-parallel converting unit 20 converts the serially input branch metrics, corresponding to 3 trellis diagrams, generated over 3 main clock period in the branch metric calculation unit 10 to the parallel branch metrics, and outputs the parallel branch metrics to the addition/comparison/selection unit 30.

The clock frequency dividing unit 60 divides the frequency of the main clock to generate an auxiliary clock having one-third of the main clock frequency. The auxiliary clock is supplied to the addition/comparison/selection unit 30 and the path memory 40.

Figure 6:
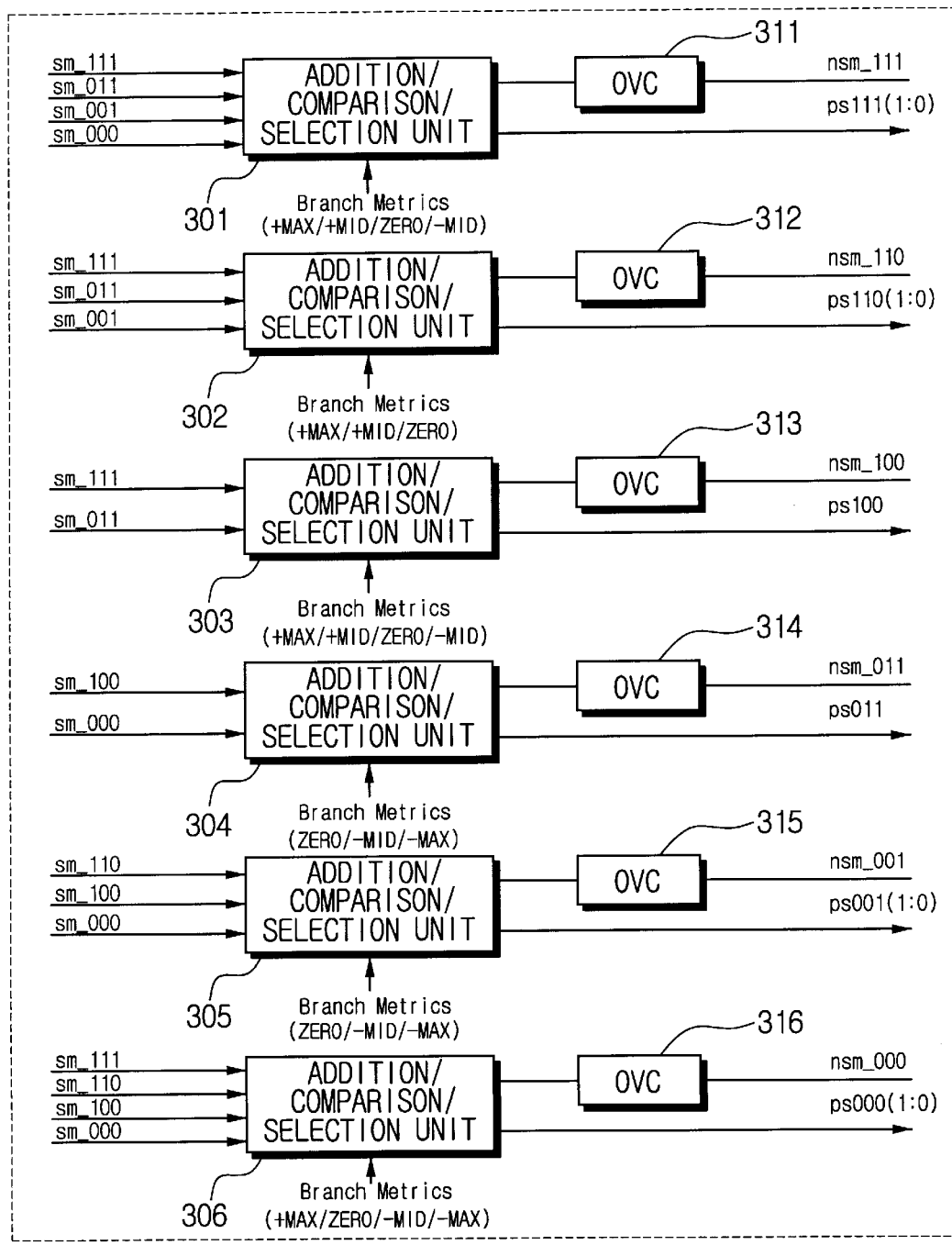
FIG. 6 is a block diagram showing a structure of an addition/comparison/selection unit of the radix-8 Viterbi detector of the present invention for use in an optical disk system.

FIG. 6 is a block diagram showing a structure of the addition/comparison/selection unit 30 of the radix-8 Viterbi detector of the present invention.

The addition/comparison/selection unit 30 is configured based on the trellis structure shown in FIG. 3B. Each of the addition/comparison/selection units 301–306 is provided with 3 branch metrics output from the serial-to-parallel converting unit 20 at an auxiliary clock frequency.

And, each of the addition/comparison/selection units 301–306 adds the five kinds of branch metrics generated by the branch metric calculation unit 10 and the state metrics previously stored in each of the addition/comparison/selection units 301–306 to obtain the new state metrics. Then, each of the addition/comparison/selection units 301–306 selects the minimum state metric as a determined survival path, and outputs the minimum state metric and the accordingly determined path selection result.

The over flow control means 311–316 monitor all the state metrics and if they detect that all the state metrics exceed a predetermined value they subtract a certain value from all the state metrics before they output the new state metrics (nsm).

The Viterbi detector processes perpetually for the infinite input data. Accordingly, since the state metric is accumulated with the new selected branch metric successively, the state metric value increases continuously. By the way, the difference between the maximum state metric and the minimum state metric does not increase infinitely, but converges to a certain value. This is because, between the two state metrics to be transited to one state in the trellis, the smaller one is always selected.

Figure 7:
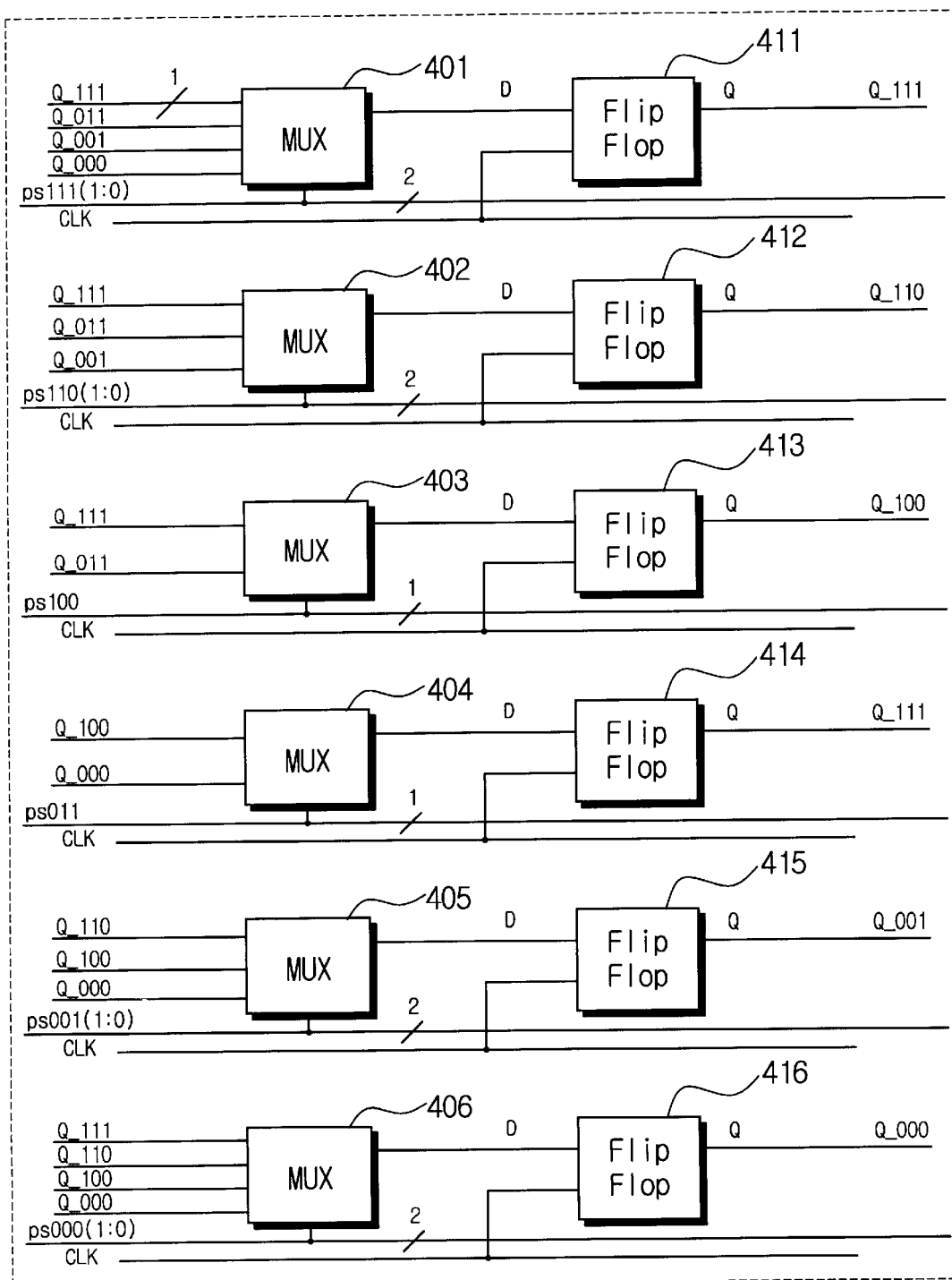
FIG. 7 is a block diagram showing a structure of a path memory of the radix-8 Viterbi detector of the present invention for use in an optical disk system.

FIG. 7 is a block diagram showing a structure of the path memory of the radix-8 Viterbi detector of the present invention.

Each of the multiplexers 401–406 selects a register corresponding to a survival path among the candidate paths using the path selection result generated by each of the addition/comparison/selection units 301–306. The state registers 411–416 store the trellis outputs from the multiplexers 401–406 in their lower 3 bits and shift right the existing 3 trellis state bits. The higher significant 3 bits stored in each of the state registers 411–416 are output from the path memory 40.

And, the 3 bits output from the path memory 40 are supplied to the parallel-to-serial converting unit 50. The parallel-to-serial converting unit 50 converts the parallel input 3 bits to serial bits and outputs them bit by bit at the channel clock speed to generate the final Viterbi output.

In the following, the second embodiment of the present invention will be described.

The second embodiment of the present invention is a radix-16 Viterbi detector, which is equivalent to the combined four radix-2 Viterbi stages.

Figure 8A:
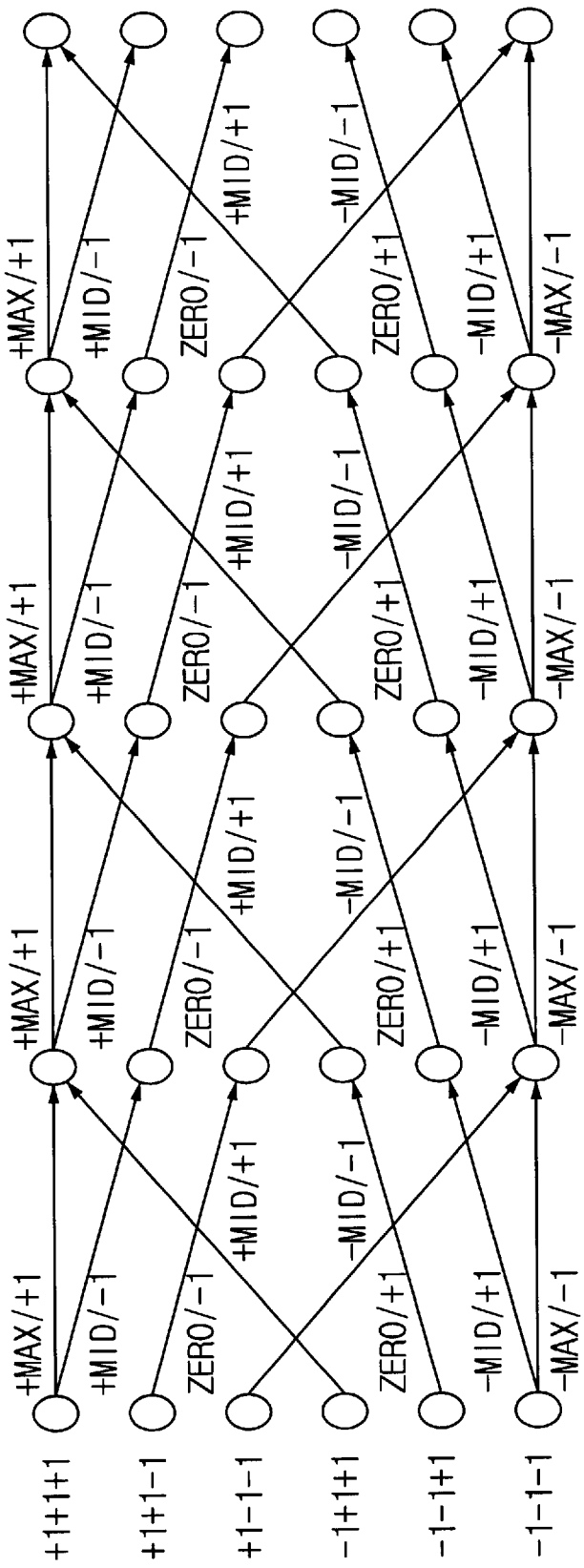
FIG. 8A is a diagrammatic view showing a trellis of a conventional Viterbi detector comprising four radix-2 Viterbi stages.

FIG. 8A is a diagrammatic view showing a trellis of a conventional Viterbi detector comprising four radix-2 Viterbi stages, wherein the input signal is assumed to have a channel characteristic of an optical disk represented by PR[a, b, b, a] (i.e., $a+bz^{-1}+bz^{-2}+az^{-3}$).

Accordingly, the data waveforms having 3T to 1T passed the channel have 5 levels of amplitude, +MAX, +MID, ZERO, −MID and −MAX.

The passage of the input signal through four radix-2 Viterbi stages can be expressed as the passage of the input signal through a single radix-16 Viterbi stage.

Figure 8B:
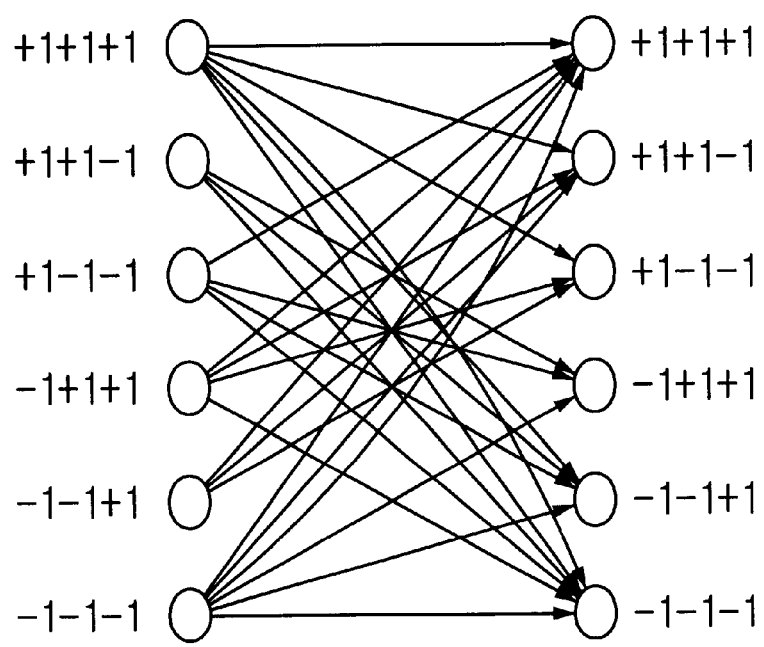
FIG. 8B is a diagrammatic view showing a trellis of a radix-16 Viterbi detector for use in an optical disk system according to an embodiment of the present invention.

FIG. 8B is a diagrammatic view showing a trellis of a radix-16 Viterbi detector according to the second embodiment of the present invention, and FIG. 8C shows a table illustrating the change of the states of and the output of the Viterbi detector comprising four radix-2 Viterbi stages in response to the input signals.

As illustrated in FIG. 8B, using radix-16, 4 data can be obtained simultaneously for one operation clock.

Figure 9:
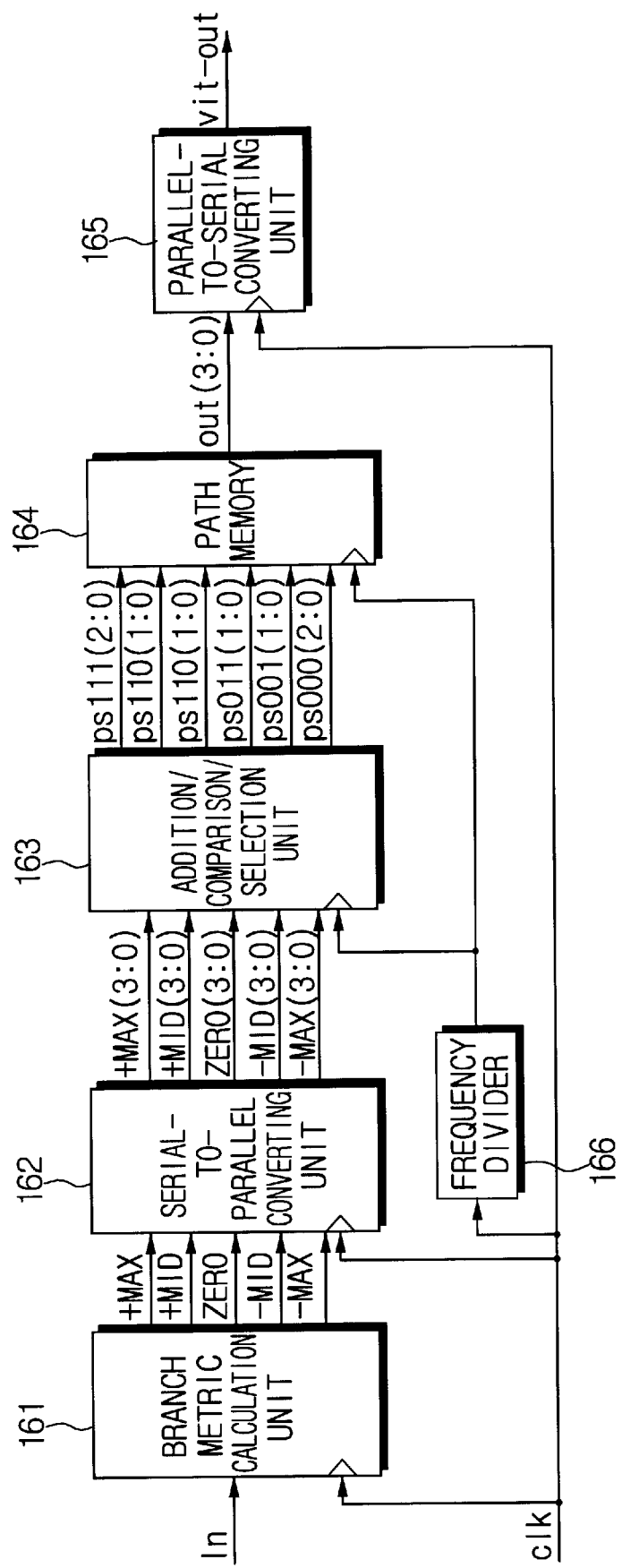
FIG. 9 is a block diagram showing a radix-16 Viterbi detector of another embodiment of the present invention for use in an optical disk system.

FIG. 9 is a block diagram showing a radix-16 Viterbi detector of the present invention configured according to the radix-16 trellis diagram illustrated in FIG. 8B.

Referring to FIG. 9, the radix-16 Viterbi detector of the present invention for use in an optical disk system comprises a branch metric calculation unit 161, a serial-to-parallel conversion means 162, an addition/comparison/selection unit 163, a path memory 164, a parallel-to-serial converting unit 165, and a clock frequency dividing unit 166.

The branch metric calculation unit 161 can be used commonly regardless of the radix of the Viterbi detector, and operates at the channel clock that is not subjected to the frequency-division.

The serial-to-parallel conversion means 162 converts the serially input branch metrics, corresponding to 4 trellis diagram, generated in the branch metric calculation unit 161 over 4 main clock periods to the parallel branch metrics, and outputs the parallel branch metrics to the addition/comparison/selection unit 163.

The clock frequency dividing unit 166 divides the frequency of the main clock into one-fourth to generate an auxiliary clock. The auxiliary clock is supplied to the addition/comparison/selection unit 163 and the path memory 164.

Figure 10:
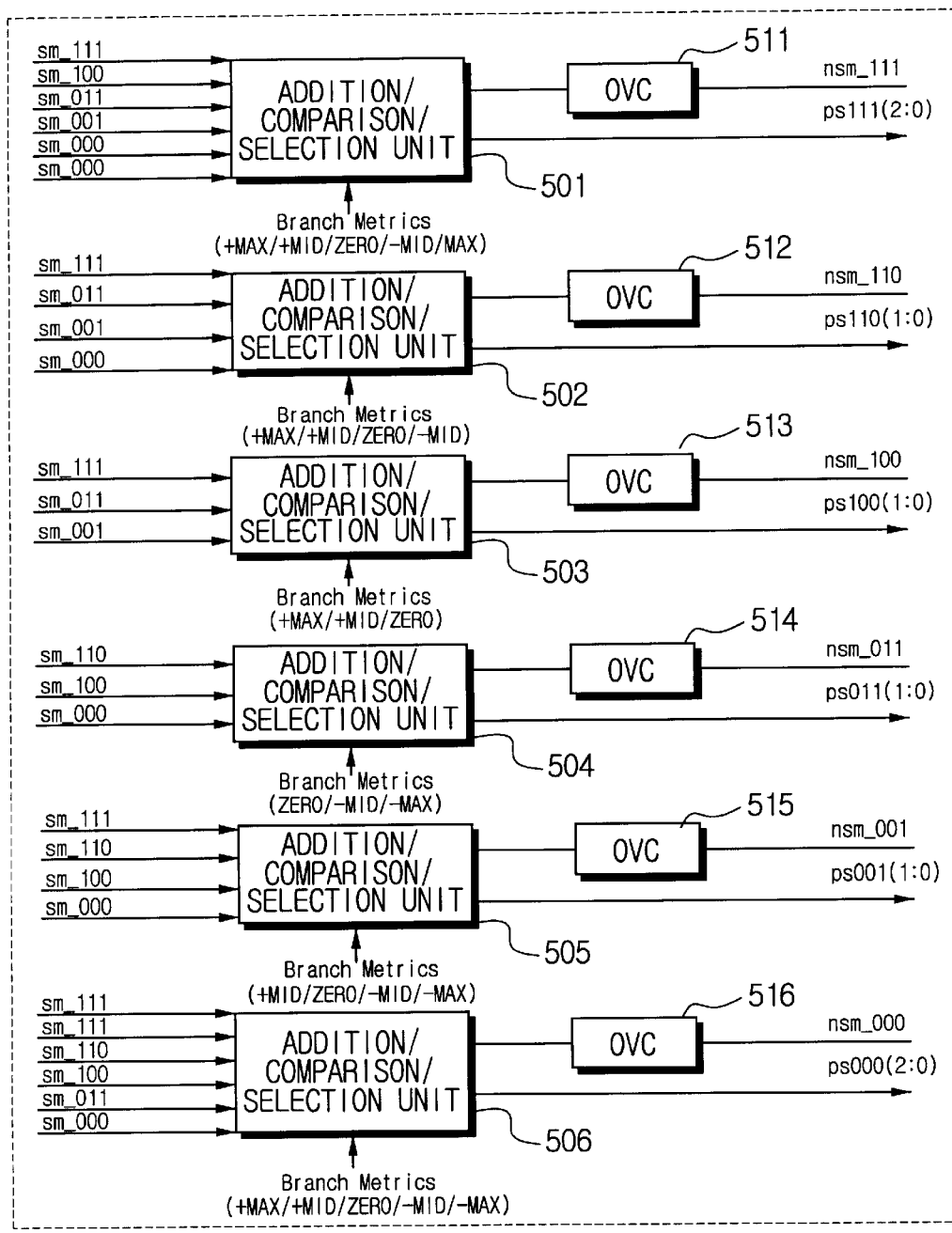
FIG. 10 is a block diagram showing a structure of an addition/comparison/selection unit of the radix-16 Viterbi detector of the present invention for use in an optical disk system.

FIG. 10 is a block diagram showing the structure of the addition/comparison/selection unit 163 adopted in the radix-16 Viterbi detector.

The addition/comparison/selection unit 163 is configured according to the trellis diagram shown in FIG. 8B. Each of the addition/comparison/selection units 501–506 is provided with the four branch metrics output from the serial-to-parallel converting unit 162 at the auxiliary clock frequency.

And, each of the addition/comparison/selection units 501–506 adds each of the five branch metrics generated by the branch metric calculation unit 161 and each of the state metrics previously stored in respective addition/comparison/selection units 501–506 to obtain the new state metrics. And, then, each of the addition/comparison/selection units 501–506 selects the minimum new state metric to determine the survival path, and outputs the minimum new state metric along with the determined path selection (ps) result.

The over flow control means 511–516 monitor all the selected state metrics in order to prevent occurrence of overflow. And, if the over flow control means 511–516 detect that all the state metrics exceed a predetermined value, the over flow control means 511–516 subtract a certain value from all the selected state metrics before the over flow control means 511–516 output the selected state metrics as the new state metrics (nsm).

Figure 11:
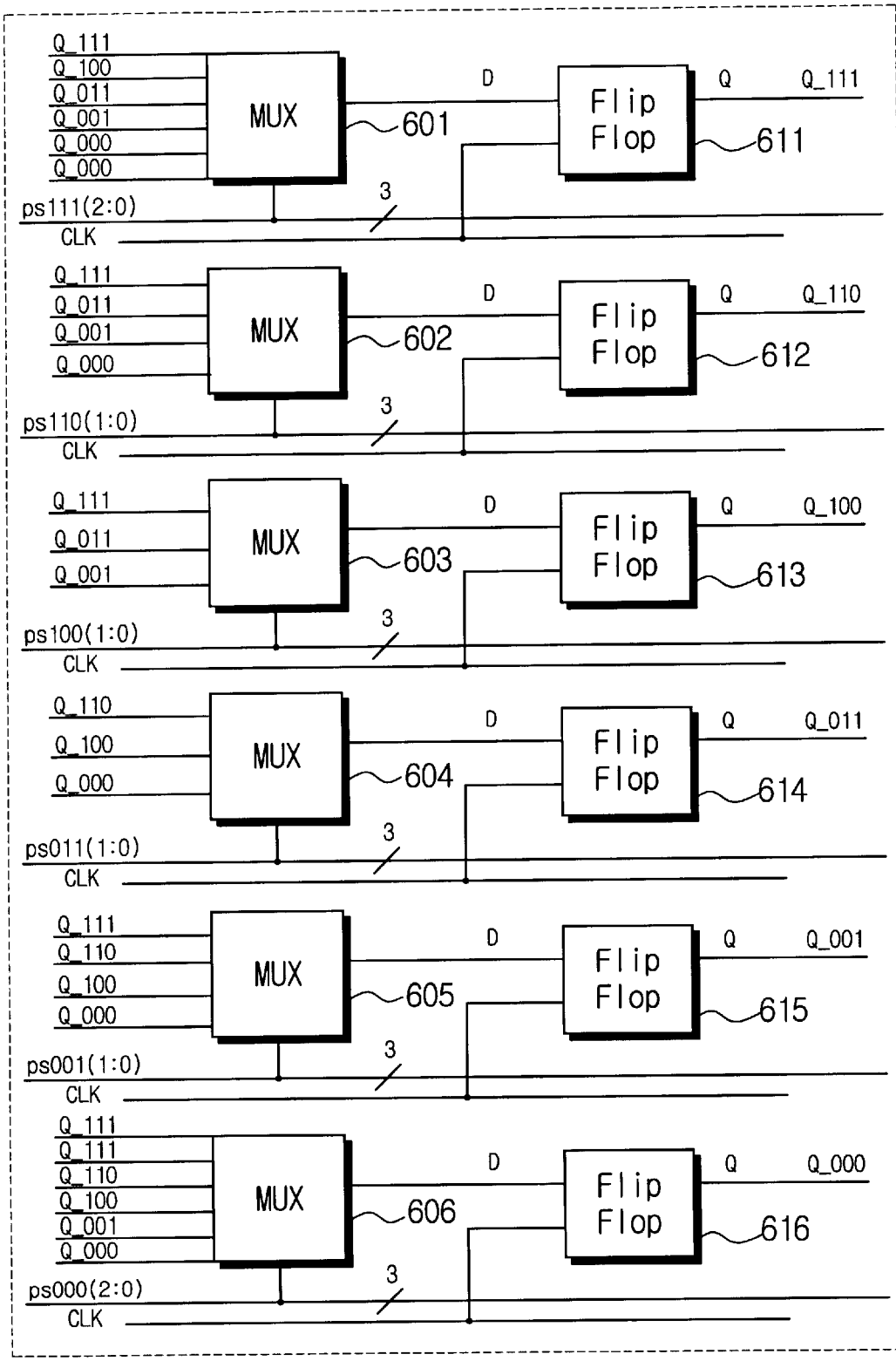
FIG. 11 is a block diagram showing a structure of a path memory of the radix-16 Viterbi detector of the present invention for use in an optical disk system.

FIG. 11 is a block diagram showing a structure of a path memory of the radix-16 Viterbi detector of the present invention.

Each of the multiplexers 601–606 selects a register corresponding to the survival path among the candidate paths using the path selection (ps) result generated by the addition/comparison/selection unit 501–506. The state registers 611–616 store the trellis outputs from the multiplexors 601–606 in their lower 4 bits and shift right the existing 4 trellis state bits. The higher significant 4 bits previously stored in the state registers 611–616 are shift out as the output of the path memory 164.

And, the 4 bits output from the path memory 164 are applied to the parallel-to-serial converting unit 165. The parallel-to-serial converting unit 165 converts the input parallel 4 bits to serial bits and outputs them bit by bit at the channel clock speed as the final Viterbi output.

Therefore, according to the present invention, the radix-8 Viterbi detector is structured by just one trellis stage, which corresponds to the conventional three radix-2 trellis stages, and operates the addition/comparison/selection unit and the path memory at the clock frequency corresponding to one-third of the channel frequency.

Further, according to the present invention, the radix-16 Viterbi detector is structured by just one trellis stage, which corresponds to the conventional four radix-2 trellis stages, and is able to operate the addition/comparison/selection unit and the path memory at the clock frequency corresponding to one-fourth of the channel frequency.

According to the present invention, the radix-8 and radix-16 Viterbi detectors for use in the optical disk system designed to improve the operation speed while executing the known Viterbi detection operations are provided by means of designing the operational channel frequencies of the addition/comparison/selection unit and the path memory, which process the complicated operations, to be lower than the channel clock frequency, thereby making it possible to cope with the multiple times higher speed.

Further, utilizing the radix 8 or radix 16 Viterbi structures can calculate a new state metric from 3 or 4 states by one time operation over every 3 or 4 clocks.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A radix-8 Viterbi detector for use in a signal reproduction apparatus for a high speed optical disk, comprising:
    a frequency dividing unit for dividing a main clock frequency to generate an auxiliary clock at one-third of the main clock frequency;
    a branch metric calculation unit for calculating each of a plurality of branch metrics via a predetermined transfer function using data input at the main clock frequency;
    a serial-to-parallel converting unit for outputting each of the branch metrics calculated by said branch metric calculation unit at the main clock frequency in units of 3 state bits;
    an addition/comparison/selection unit for adding the branch metrics input from said serial-to-parallel converting unit and previous state metrics stored before the 3 state bits are input and for comparing the addition results to select and output the minimum of the addition results as a new state metric, and for outputting a corresponding path selection signal, at the auxiliary clock frequency;
    a path memory for storing the path selection signal and for outputting parallel data corresponding to said path selection signal, at the auxiliary clock frequency; and
    a parallel-to-serial converting unit for converting the parallel data output from said path memory into serial data.

2. The radix-8 Viterbi detector of claim 1, wherein said addition/comparison/selection unit comprises an overflow control means for preventing overflow in adding operations.

3. The radix-8 Viterbi detector of claim 1, wherein said path memory comprises:
- a multiplexer for selecting a path based on said path selection signal; and
- a state register for storing the data of the selected path.

4. The radix-8 Viterbi detector of claim 3, wherein the state register is a flip-flop.

5. A radix-16 Viterbi detector for use in a signal reproduction apparatus for a high speed optical disk, comprising:
- a frequency dividing unit for dividing a main clock frequency to generate an auxiliary clock at one-fourth of the main clock frequency;
- a branch metric calculation unit for calculating each of a plurality of branch metrics via a predetermined transfer function using data input at the main clock frequency;
- a serial-to-parallel converting unit for outputting each of the branch metrics calculated by said branch metric calculation unit at the main clock frequency in units of 4 state bits;
- an addition/comparison/selection unit for adding the branch metrics input from said serial-to-parallel converting unit and previous state metrics stored before the 4 state bits are input and for comparing the addition results to select and output the minimum of the addition results as a new state metric, and for outputting a corresponding path selection signal, at the auxiliary clock frequency;
- a path memory for storing the path selection signal and for outputting parallel data corresponding to said path selection signal, at the auxiliary clock frequency; and
- a parallel-to-serial converting unit for converting the parallel data output from said path memory into serial data.

6. The radix-16 Viterbi detector of claim 5, wherein said addition/comparison/selection unit comprises an overflow control means for preventing overflow in adding operations.

7. The radix-16 Viterbi detector of claim 5, wherein said path memory comprises:
- a multiplexer for selecting a path based on said path selection signal; and
- a state register for storing the data of the selected path.

8. The radix-16 Viterbi detector of claim 7, wherein the state register is a flip-flop.

9. A radix-N Viterbi detector for use in a signal reproduction apparatus for a high speed optical disk, comprising:
- a frequency dividing unit for dividing a main clock frequency to generate an auxiliary clock at one-Nth of the main clock frequency;
- a branch metric calculation unit for calculating each of a plurality of branch metrics via a predetermined transfer function using data input at the main clock frequency;
- a serial-to-parallel converting unit for outputting each of the branch metrics calculated by said branch metric calculation unit at the main clock frequency in units of N state bits;
- an addition/comparison/selection unit for adding the branch metrics input from said serial-to-parallel converting unit and previous state metrics stored before the N state bits are input and for comparing the addition results to select and output the minimum of the addition results as a new state metric, and for outputting a corresponding path selection signal, at the auxiliary clock frequency;
- a path memory for storing the path selection signal and for outputting parallel data corresponding to said path selection signal, at the auxiliary clock frequency; and
- a parallel-to-serial converting unit for converting the parallel data output from said path memory into serial data.

10. The radix-N Viterbi detector of claim 9, wherein N is greater than or equal to 2.

11. The radix-N Viterbi detector of claim 9, wherein said addition/comparison/selection unit comprises an overflow control means for preventing overflow in adding operations.

12. The radix-N Viterbi detector of claim 9, wherein said path memory comprises:
- a multiplexer for selecting a path based on said path selection signal; and
- a state register for storing the data of the selected path.

13. The radix-N Viterbi detector of claim 12, wherein the state register is a flip-flop.

* * * * *